United States Patent
Lai et al.

(10) Patent No.: US 11,355,431 B2
(45) Date of Patent: Jun. 7, 2022

(54) SEMICONDUCTOR STRUCTURE

(71) Applicant: UNITED MICROELECTRONICS CORPORATION, Hsinchu (TW)

(72) Inventors: Chien-Ming Lai, Tainan (TW); Zhi-Rui Sheng, Singapore (SG); Hui-Ling Chen, Kaohsiung (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 17/064,609

(22) Filed: Oct. 7, 2020

(65) Prior Publication Data
US 2022/0108946 A1   Apr. 7, 2022

(51) Int. Cl.
*H01L 23/522* (2006.01)
*H01L 49/02* (2006.01)

(52) U.S. Cl.
CPC .......... *H01L 23/5223* (2013.01); *H01L 28/90* (2013.01)

(58) Field of Classification Search
CPC .................................................. H01L 23/5223
See application file for complete search history.

(56) References Cited

U.S. PATENT DOCUMENTS

| | | | |
|---|---|---|---|
| 5,583,359 A * | 12/1996 | Ng | H01L 23/5223 257/532 |
| 6,266,226 B1 | 7/2001 | Hayashi | |
| 6,445,056 B2 | 9/2002 | Nakashima | |
| 6,597,562 B1 * | 7/2003 | Hu | H01L 23/5223 257/532 |
| 6,635,916 B2 | 10/2003 | Aton | |
| 6,980,414 B1 | 12/2005 | Sutardja | |
| 10,290,571 B2 | 5/2019 | Yu et al. | |
| 2006/0112765 A1 * | 6/2006 | Malvern | G01P 15/0802 73/514.32 |
| 2007/0291439 A1 * | 12/2007 | Yeh | H01L 23/5223 361/301.1 |
| 2020/0043874 A1 * | 2/2020 | Sira | H01L 23/5223 |

* cited by examiner

Primary Examiner — Omar F Mojaddedi

(57) ABSTRACT

A semiconductor structure includes a first layer, a second layer, a first interconnection layer, and a second interconnection layer. The first layer includes an upper electrode pattern, and the second layer includes a lower electrode pattern, wherein the upper electrode pattern is opposite to the lower electrode pattern. The first interconnection layer includes a plurality of first interconnect structures electrically connected on the upper electrode pattern. The second interconnection layer includes a plurality of second interconnect structures electrically connected on the lower electrode pattern. The first interconnect structures on the upper electrode pattern are hybrid bonded with the second interconnect structures on the lower electrode pattern. Therefore, the upper electrode patterns and the lower electrode patterns are joined by hybrid bonding to form a capacitor element.

12 Claims, 5 Drawing Sheets

SEMICONDUCTOR STRUCTURE

FIELD OF THE INVENTION

The present invention relates to a semiconductor structure, and more particularly to a semiconductor structure with a capacitor element formed by hybrid bonding.

BACKGROUND OF THE INVENTION

Three-dimensional semiconductor components are formed by stacking semiconductor wafers (or semiconductor substrates) or dies, wherein copper-copper (Cu—Cu) connections or through-silicon vias (TSV), for example, are used to form electrical connections in the vertical direction. Compared with the traditional planar manufacturing process, three-dimensional semiconductor devices can not only reduce occupied areas, but also reduce power loss and obtain improved performance to achieve performance improvement.

A Cu-to-Cu bonding technology currently used in the semiconductor wafers (or substrates) refers to a process of coating a macromolecular dielectric layer fully on bonding surfaces of two semiconductor wafers (or substrates) before bonding the two semiconductor wafers (or substrates). Next, a pose cure is performed on the macromolecular dielectric layer so that the macromolecular dielectric layer is fully filled in gaps between Cu-to-Cu bonding surfaces. In this way, a hybrid bonding may then be achieved by a metal-to-metal bonding (i.e., the Cu-to-Cu bonding) and a dielectric layer-to-dielectric layer bonding.

Among various technologies for stacking semiconductor substrates, hybrid bonding technology is currently a project that the industry pays attention to and is actively developed because it can form a high-density electrical connection structure.

SUMMARY OF THE INVENTION

The present invention provides a semiconductor structure, wherein a capacitor element is formed in the semiconductor stacked structure by hybrid bonding, and thereby the capacitor element can improve the charge accumulation effect.

In order to achieve one or a portion of all of the objects or other objects, an embodiment of the invention provides a semiconductor structure including a first layer, a second layer, a first interconnection layer, and a second interconnection layer. The first layer includes a first electrode pattern and a second electrode pattern, wherein the first electrode pattern and the second electrode pattern are isolated from each other. The second layer is spaced apart from and opposite to the first layer, wherein the second layer includes a third electrode pattern and a fourth electrode pattern, and the third electrode pattern and the fourth electrode pattern are isolated from each other, wherein the first electrode pattern is opposite to the third electrode pattern, and the second electrode pattern is opposite to the fourth electrode pattern. The first interconnection layer is disposed on one side of the first layer facing the second layer, wherein the first interconnection layer includes a plurality of first interconnect structures electrically connected on the first electrode pattern and the second electrode pattern. The second interconnection layer is disposed on one side of the second layer facing the first layer, wherein the second interconnection layer includes a plurality of second interconnect structures electrically connected on the third electrode pattern and the fourth electrode pattern, wherein the first interconnect structures on the first electrode pattern are hybrid bonded with the second interconnect structures on the third electrode pattern, and the first interconnect structures on the second electrode pattern are hybrid bonded with the second interconnect structures on the fourth electrode pattern.

In one embodiment of the invention, the semiconductor structure further includes a bonding interface between the first interconnection layer and the second interconnection layer, wherein the first interconnect structures are in contact with the second interconnect structures at the bonding interface.

In one embodiment of the invention, the first interconnection layer further includes a first dielectric material, the second interconnection layer further includes a second dielectric material, and the first dielectric material is in contact with the second dielectric material at the bonding interface.

In one embodiment of the invention, the number of the first interconnect structures is the same as the number of the second interconnect structures.

In one embodiment of the invention, the first electrode pattern and the third electrode pattern form a hybrid bonding, and the second electrode pattern and the fourth electrode pattern form a hybrid bonding.

In one embodiment of the invention, the first electrode pattern and the second electrode pattern have different electric potentials, or the third electrode pattern and the fourth electrode pattern have different electric potentials, whereby a capacitor element is formed by the first electrode pattern, the second electrode pattern, the third electrode pattern and the fourth electrode pattern.

In one embodiment of the invention, the first electrode pattern includes a plurality of first teeth arranged at intervals and a first connecting portion connecting the plurality of first teeth, the second electrode pattern includes a plurality of second teeth arranged at intervals and a second connecting portion connecting the plurality of second teeth, and the plurality of first teeth and the plurality of second teeth are arranged in a mutually staggered fashion from opposite directions.

In one embodiment of the invention, the third electrode pattern includes a plurality of third teeth arranged at intervals and a third connecting portion connecting the plurality of third teeth, the fourth electrode pattern includes a plurality of fourth teeth arranged at intervals and a fourth connecting portion connecting the plurality of fourth teeth, and the plurality of third teeth and the plurality of fourth teeth are arranged in a mutually staggered fashion from opposite directions, wherein the third connecting part and the plurality of third teeth correspond to the first connecting part and the plurality of first teeth respectively, and the fourth connecting part and the plurality of fourth teeth correspond to the second connecting part and the plurality of second teeth respectively.

In one embodiment of the invention, the first connecting portion and the third connecting portion are electrically connected to a first voltage, the second connecting portion and the fourth connecting portion are electrically connected to a second voltage, and the first voltage is different from the second voltage.

In one embodiment of the invention, the first interconnect structures are disposed on the first teeth and the second teeth, and the second interconnect structures are disposed on the third teeth and the fourth teeth.

In one embodiment of the invention, the first electrode pattern further includes a plurality of first protrusions arranged at intervals on a first side surface of each of the first teeth, the second electrode pattern further includes a plurality of second protrusions arranged at intervals on a second side surface of each of the second teeth, the first side surface and the second side surface are opposite, and the first protrusions and the second protrusions are arranged in a staggered manner.

In one embodiment of the invention, the third electrode pattern further includes a plurality of third protrusions arranged at intervals on a third side surface of each of the third teeth, the fourth electrode pattern further includes a plurality of fourth protrusions arranged at intervals on a fourth side surface of each of the fourth teeth, the third side surface and the fourth side surface are opposite, and the third protrusions and the fourth protrusions are arranged in a staggered manner.

In one embodiment of the invention, the first interconnect structures are disposed on the first protrusions and the second protrusions, and the second interconnect structures are disposed on the third protrusions and the fourth protrusions.

In one embodiment of the invention, the first interconnect structures and the second interconnect structures are pads, via contacts, or combinations thereof.

According to the embodiments of the present invention, the semiconductor structure includes a capacitor element formed in the semiconductor stacked structure, and the capacitor element is formed by hybrid bonding. Since the upper electrode patterns and the lower electrode patterns are joined by hybrid bonding to form a capacitor element, the capacitor element can improve the charge accumulation effect through the vertical cross section areas of the electrode pattern and the upper and lower interconnection structures.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
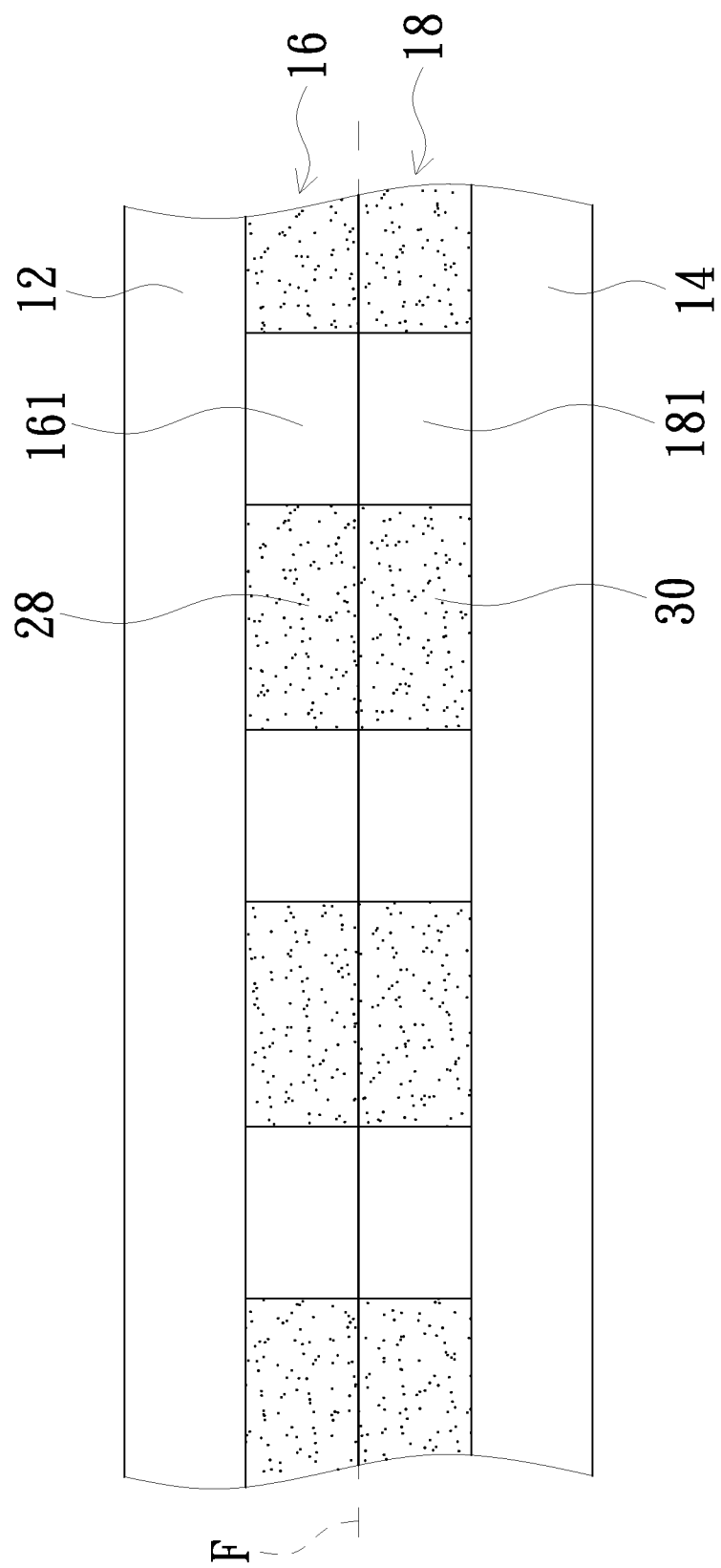
FIG. 1 is a schematic cross-sectional diagram of a semiconductor structure according to an embodiment of the present invention.
Figure 2:
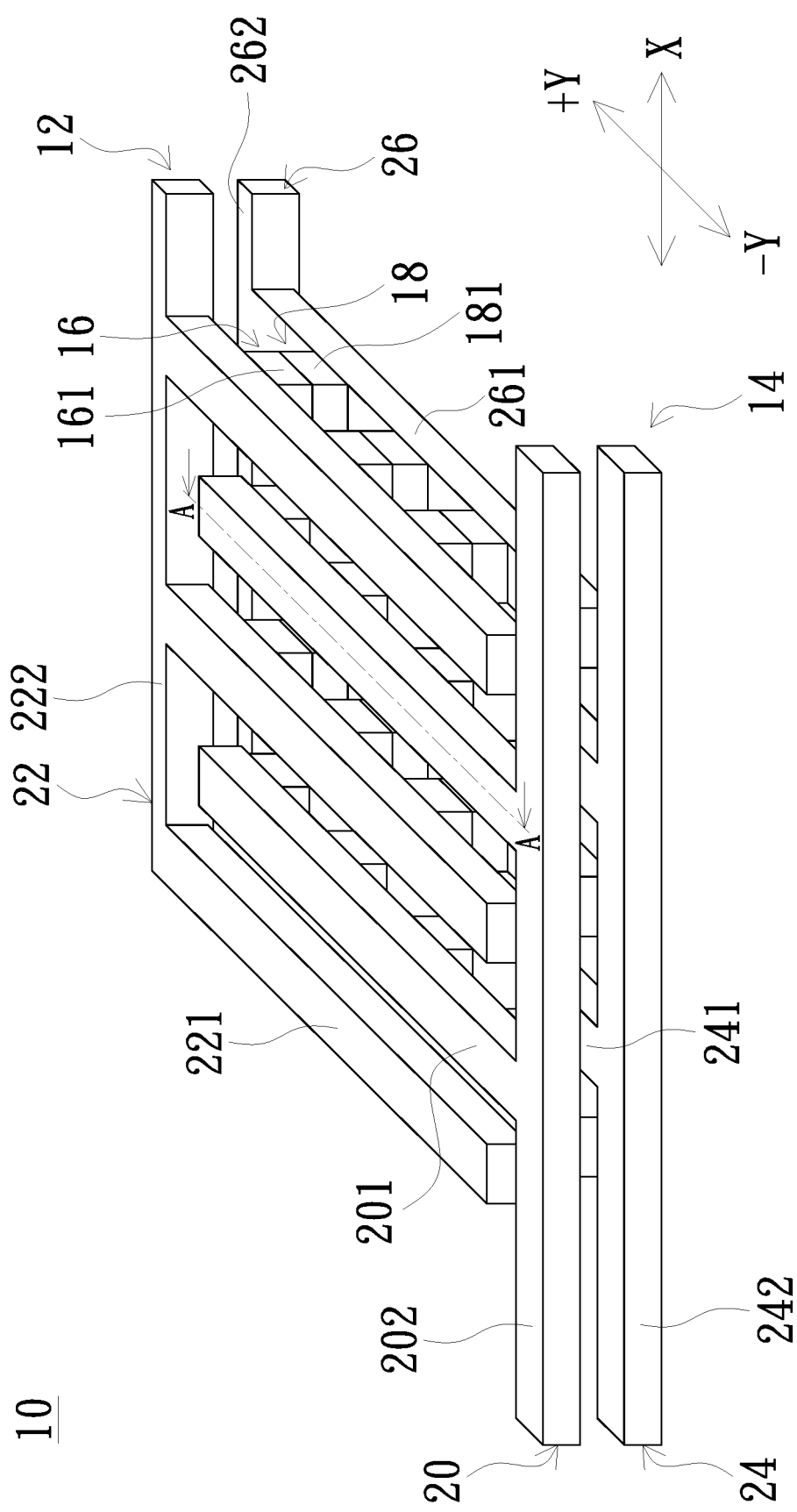
FIG. 2 is a three-dimensional schematic diagram of a semiconductor structure according to an embodiment of the present invention.

FIG. 1 is a schematic cross-sectional diagram of a semiconductor structure according to an embodiment of the present invention. FIG. 2 is a three-dimensional schematic diagram of a semiconductor structure according to an embodiment of the present invention. The semiconductor structure includes, for example, a capacitor element formed in the semiconductor stacked structure, wherein the capacitor element is formed by hybrid bonding. As shown in FIG. 1, the semiconductor structure 10 includes a first layer 12, a second layer 14, a first interconnection layer 16 and a second interconnection layer 18. In one embodiment, the first layer 12 and the second layer 14 may be two inner layers within the semiconductor stacked structure, and the second layer 14 are spaced apart from and opposite to the first layer 12.

As shown in FIG. 2, the first layer 12 includes a first electrode pattern 20 and a second electrode pattern 22, and the first electrode pattern 20 and the second electrode pattern 22 are isolated from each other. The second layer 14 includes a third electrode pattern 24 and a fourth electrode pattern 26, and the third electrode pattern 24 and the fourth electrode pattern 26 are isolated from each other. The first electrode pattern 20 is opposite to the third electrode pattern 24, the second electrode pattern 22 is opposite to the fourth electrode pattern 26, and by the arrangements of the first interconnection layer 16 and the second interconnection layer 18, the first electrode pattern 20 and the third electrode pattern 24 form a hybrid bonding, and the second electrode pattern 22 and the fourth electrode pattern 26 form a hybrid bonding. In one embodiment, the first electrode pattern 20 and the second electrode pattern 22 have different electric potentials, or the third electrode pattern 24 and the fourth electrode pattern 26 have different electric potentials, whereby a capacitor element is formed by the first electrode pattern 20, the second electrode pattern 22, the third electrode pattern 24 and the fourth electrode pattern 26.

Following the above description, as shown in FIG. 1 and FIG. 2, the first interconnection layer 16 is disposed on one side of the first layer 12 facing the second layer 14, and the first interconnection layer 16 includes a plurality of first interconnect structures 161. The second interconnection layer 18 is disposed on one side of the second layer 14 facing the first layer 12, and the second interconnection layer 18 includes a plurality of second interconnect structures 181. The plurality of first interconnect structures 161 are formed on the first electrode pattern 20 and the second electrode pattern 22, and are electrically connected with the first electrode pattern 20 and the second electrode pattern 22. The plurality of second interconnect structures 181 are formed on the third electrode pattern 24 and the fourth electrode pattern 26, and are electrically connected with the third electrode pattern 24 and the fourth electrode pattern 26. In one embodiment, the first interconnect structures 161 and the second interconnect structures 181 may be pads, via contacts, or combinations thereof, for example. The first interconnect structures 161 and the second interconnect structures 181 may include conductive materials, including but not limited to W, Co, Cu, Al, silicide or any combination thereof.

In one embodiment, the number of the first interconnect structures 161 is the same as the number of the second interconnect structures 181, and the distribution of the first interconnect structures 161 on the first electrode pattern 20 and the second electrode pattern 22 corresponds to the distribution of the second interconnect structures 181 on the third electrode pattern 24 and the fourth electrode pattern 26. The first interconnect structures 161 on the first electrode pattern 20 are bonded with the second interconnect structures 181 on the third electrode pattern 24, and the first interconnect structures 161 on the second electrode pattern 22 are bonded with the second interconnect structures 181 on the fourth electrode pattern 26. In one embodiment, there is a bonding interface F between the first interconnection layer 16 and the second interconnection layer 18, wherein the first interconnect structures 161 are in contact with the second interconnect structures 181 at the bonding interface F.

As shown in FIG. 1, the first interconnection layer 16 may further include a first dielectric material 28 (not shown in FIG. 2) and the second interconnection layer 18 may further include a second dielectric material 30 (not shown in FIG. 2), wherein the first dielectric material 28 and the second dielectric material 30 may be one or more ILD layers or IMD layers, the first interconnect structures 161 are formed in the first dielectric material 28, and the second interconnect structures 181 are formed in the second dielectric material 30. The first interconnect structures 16/second interconnect structures 18 may be formed in the first dielectric material 28/second dielectric material 30 through a single patterning process, for example, a lithography process. As shown in FIG. 1, the first dielectric material 28 is also in contact with the second dielectric material 30 at the bonding interface F. The first dielectric material 28 and the second dielectric material 30 include, but are not limited to, silicon oxide, silicon nitride, silicon oxynitride, low-dielectric-constant (low-k) dielectric materials, or any combination thereof.

Hybrid bonding is a direct bonding technology, such as a surface bonding technology that does not use an intermediate layer (such as solder or adhesive), and can simultaneously obtain a metal-metal bonding structure (i.e. the first interconnect structures and the second interconnect structures are bonded) and a dielectric material-dielectric material bonding structure. As shown in FIG. 2, due to the formation of the first interconnection layer 16 and the second interconnection layer 18, the first electrode pattern 20 and the third electrode pattern 24 form a hybrid bonding, and the second electrode pattern 22 and the fourth electrode pattern 26 form a hybrid bonding.

Figure 3:
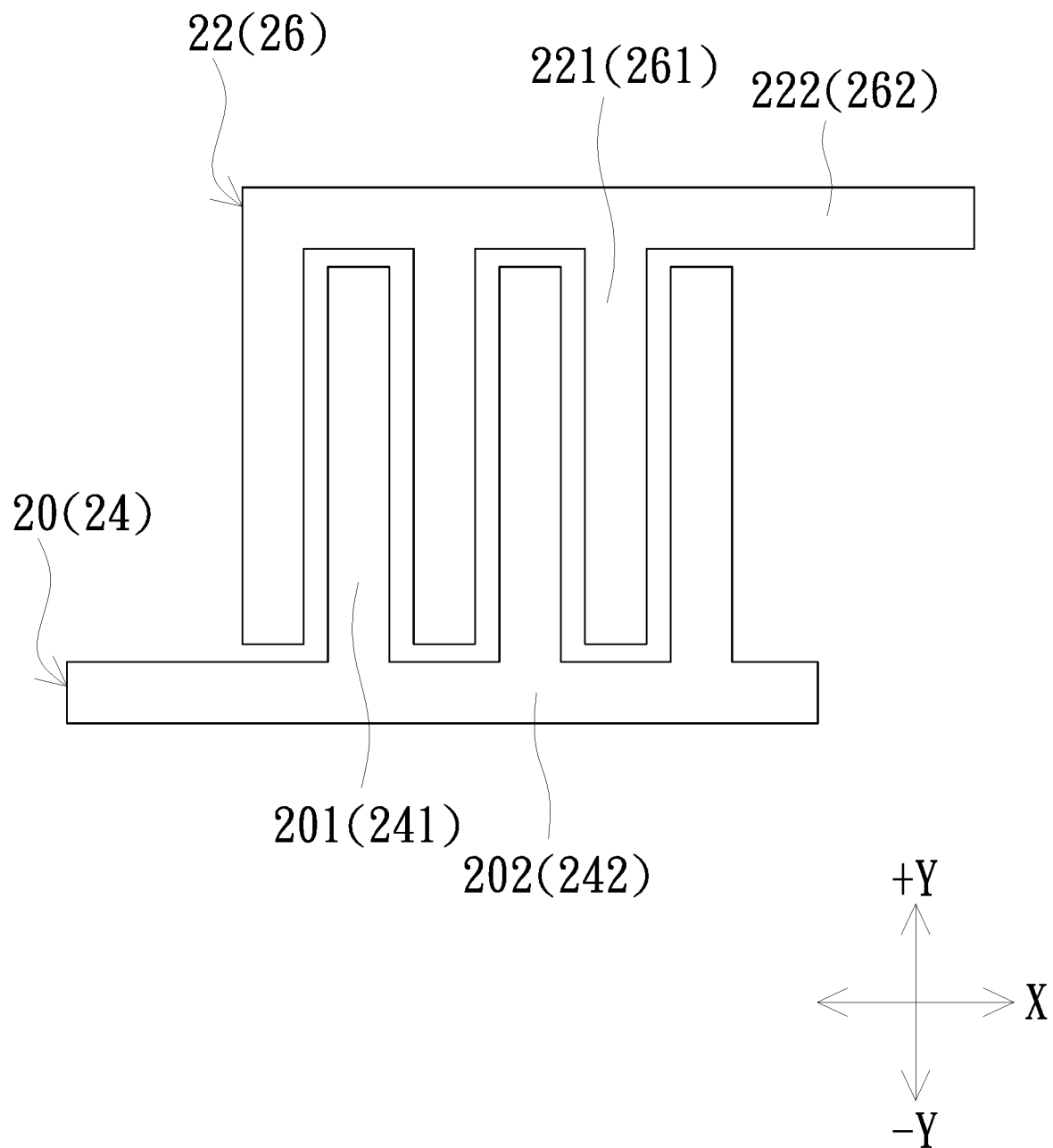
FIG. 3 is a schematic top view of the first electrode pattern and the second electrode pattern according to an embodiment of the present invention.

FIG. 3 is a schematic top view of the first electrode pattern and the second electrode pattern according to an embodiment of the present invention. Correspondingly, FIG. 3 can also be a schematic top view of the third electrode pattern and the fourth electrode pattern. In one embodiment, as shown in FIG. 3, the first electrode pattern 20 includes a plurality of first teeth 201 arranged at intervals and a first connecting portion 202 connecting the plurality of first teeth 201, the second electrode pattern 22 includes a plurality of second teeth 221 arranged at intervals and a second connecting portion 222 connecting the plurality of second teeth 221. In one embodiment, the first connecting portion 202 and the second connecting portion 222 are along a first direction, such as an X direction, and the first teeth 201 and the second teeth 221 are along a second direction, such as a Y direction, wherein the first teeth 201 may extend toward +Y direction from the first connecting portion 202 and the second teeth 221 may extend toward –Y direction from the second connecting portion 222. In the arrangement of the first electrode pattern 20 and the second electrode pattern 22, the plurality of first teeth 201 and the plurality of second teeth 221 may be arranged in a mutually staggered fashion from opposite directions.

Correspondingly, as shown in FIG. 3, the third electrode pattern 24 includes a plurality of third teeth 241 arranged at intervals and a third connecting portion 242 connecting the plurality of third teeth 241, the fourth electrode pattern 26 includes a plurality of fourth teeth 261 arranged at intervals and a fourth connecting portion 262 connecting the plurality of fourth teeth 261. As shown in FIG. 2 and FIG. 3, the third connecting portion 242 and the fourth connecting portion 262 correspond to the first connecting portion 202 and the second connecting portion 222 respectively, and are along the first direction, such as the X direction. The third teeth 241 correspond to the first teeth 201, the fourth teeth 261 correspond to the second teeth 221, the third teeth 241 may extend toward +Y direction from the third connecting portion 242, and the fourth teeth 261 may extend toward –Y direction from the fourth connecting portion 262. In the arrangement of the third electrode pattern 24 and the fourth electrode pattern 26, the plurality of third teeth 241 and the plurality of fourth teeth 261 may be arranged in a mutually staggered fashion from opposite directions.

As shown in FIG. 2, the plurality of first interconnect structures 161 are disposed on the first teeth 201 and the second teeth 221, and the plurality of second interconnect structures 181 are disposed on the third teeth 241 and the fourth teeth 261. Each of the first interconnect structures 161 on the first teeth 201 and the second teeth 221 is opposite to and bonded with each of the second interconnect structures 181 on the third teeth 241 and the fourth teeth 261.

In one embodiment, the first connecting portion 202 and the third connecting portion 242 are electrically connected to a first voltage, the second connecting portion 222 and the fourth connecting portion 262 are electrically connected to a second voltage, and the first voltage is different from the second voltage, so that the first electrode pattern 20 and the second electrode pattern 22 have different electric potentials, and/or the third electrode pattern 24 and the fourth electrode pattern 26 have different electric potentials. By arrangements of the first interconnection layer 16 and the second interconnection layer 18, the first electrode pattern 20 and the third electrode pattern 24 form a hybrid bonding, and the second electrode pattern 22 and the fourth electrode pattern 26 form a hybrid bonding, so that a capacitor element is formed by the first electrode pattern 20, the second electrode pattern 22, the third electrode pattern 24 and the fourth electrode pattern 26.

Figure 4:
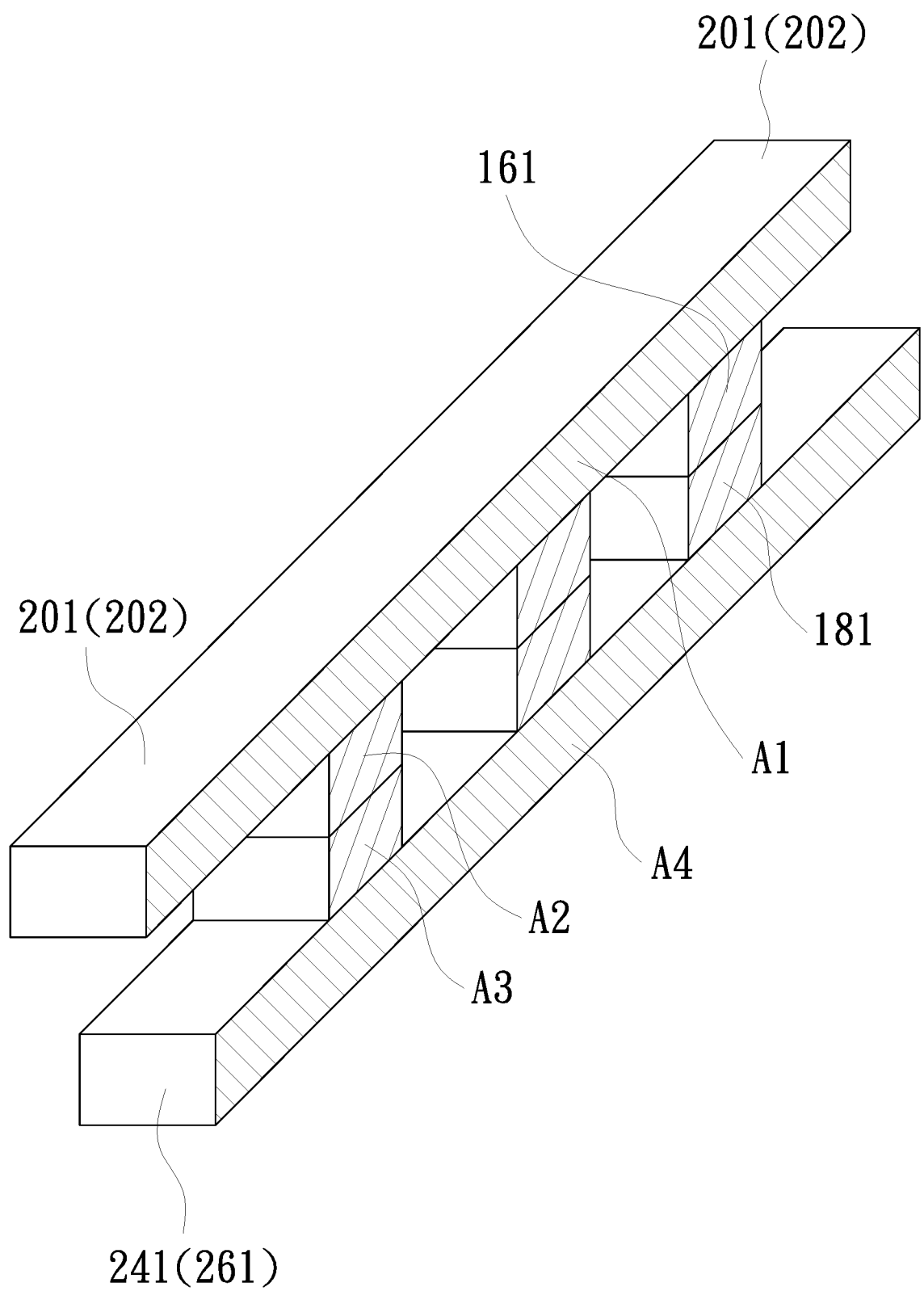
FIG. 4 is a schematic cross-sectional view of the AA line segment shown in FIG. 2.

FIG. 4 is a schematic cross-sectional view of the AA line segment shown in FIG. 2. In one embodiment of the present invention, all of the cross section area A1 of the upper teeth (such as the first teeth 201 and the second teeth 221), the cross section area A2 of the first interconnect structures 161, the cross section area A3 of the second interconnect structures 181, and the cross section area A4 of the lower teeth (such as the third teeth 241 and the fourth teeth 261) dominate capacitor charge, and the capacitor density is dominated by teeth space, length, density of interconnect structures and the cross section area of the interconnect structures. In one embodiment of the present invention, since the upper electrode patterns (such as the first electrode pattern 20 and the second electrode pattern 22) and lower electrode patterns (such as the third electrode pattern 24 and the fourth electrode pattern 26) are joined by hybrid bonding to form a capacitor element, the capacitor element can improve the charge accumulation effect through the vertical cross section areas A1, A2, A3, A4 of the electrode patterns 20, 22, 24, 26 and the upper and lower interconnection structures 161, 181.

Figure 5:
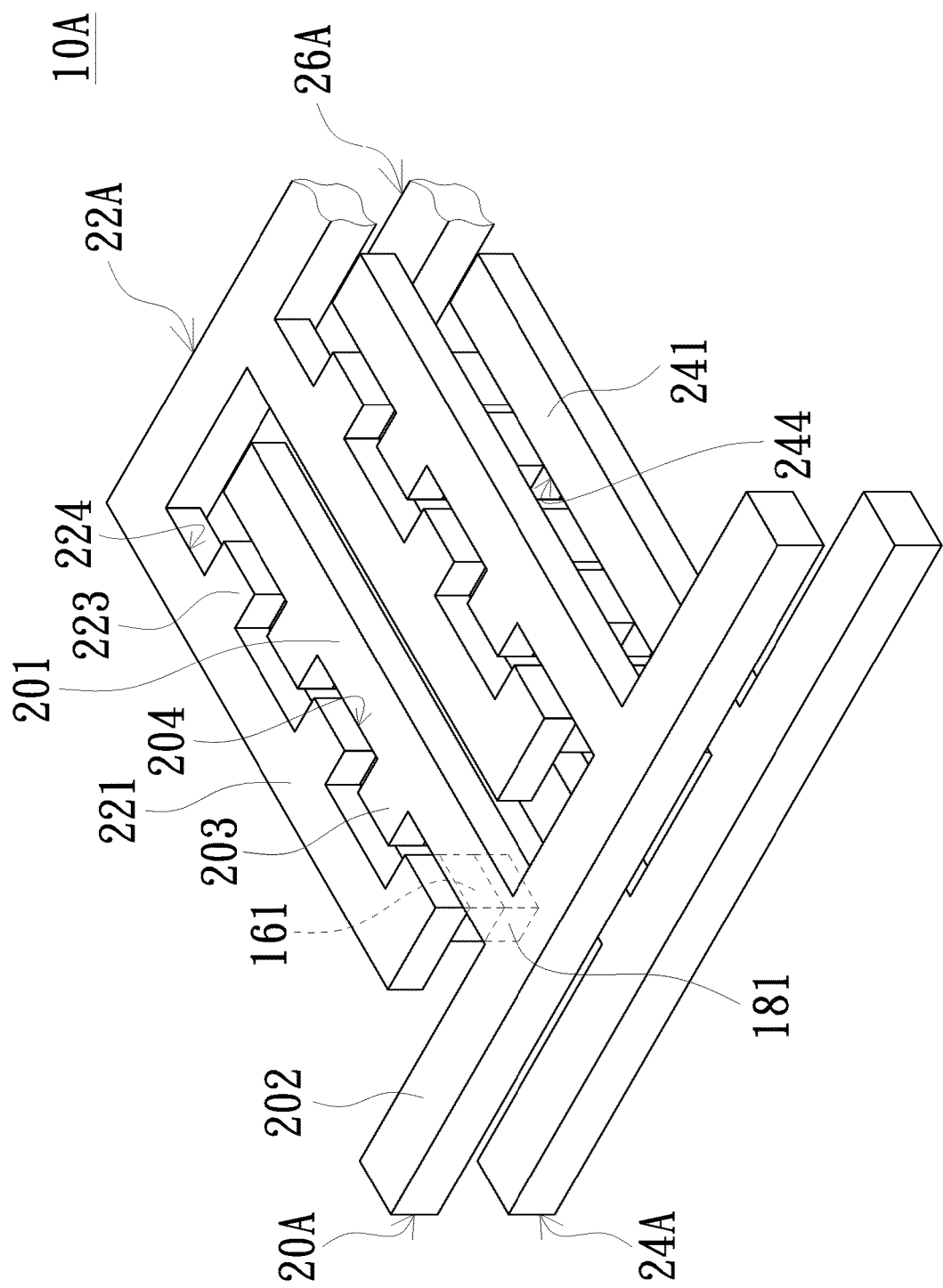
FIG. 5 is a three-dimensional schematic diagram of a semiconductor structure according to another embodiment of the present invention.

FIG. 5 is a three-dimensional schematic diagram of a semiconductor structure according to another embodiment of the present invention. As shown in FIG. 5, the main difference between the semiconductor structure 10A shown in FIG. 5 and the semiconductor structure 10 shown in FIG. 2 is that the first electrode pattern 20A further includes a plurality of first protrusions 203 arranged at intervals on a first side surface 204 of each of the first teeth 201, the second electrode pattern 22A further includes a plurality of second protrusions 223 arranged at intervals on a second side surface 224 of each of the second teeth 221, wherein the first side surface 204 and the second side surface 224 are opposite, and the first protrusions 203 and the second protrusions 223 are arranged in a staggered manner. Correspondingly, the third electrode pattern 24A further includes a plurality of third protrusions (not labeled in the figure) arranged at intervals on a third side surface 244 of each of the third teeth 241 and the fourth electrode pattern 26A further includes a plurality of fourth protrusions (not labeled in the figure) arranged at intervals on a fourth side surface (not labeled in the figure) of each of the fourth teeth (not labeled in the figure), wherein the third side surface 244 and the fourth side surface are opposite, and the third protrusions and the fourth protrusions are arranged in a staggered manner. In one embodiment, the first interconnect structures 161 are respectively disposed on the first protrusions 203 and the second protrusions 223, and the second interconnect structures 181 are respectively disposed on the third protrusions and the fourth protrusions.

According to the embodiments of the present invention, the semiconductor structure includes a capacitor element formed in the semiconductor stacked structure, and the capacitor element is formed by hybrid bonding. Since the upper electrode patterns and the lower electrode patterns are joined by hybrid bonding to form a capacitor element, the capacitor element can improve the charge accumulation effect through the vertical cross section areas of the electrode pattern and the upper and lower interconnection structures.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor structure, comprising:
   a first layer, comprising a first electrode pattern and a second electrode pattern, wherein the first electrode pattern and the second electrode pattern are isolated from each other;
   a second layer, spaced apart from and opposite to the first layer, wherein the second layer comprises a third electrode pattern and a fourth electrode pattern, and the third electrode pattern and the fourth electrode pattern are isolated from each other, wherein the first electrode pattern is opposite to the third electrode pattern, and the second electrode pattern is opposite to the fourth electrode pattern;
   a first interconnection layer, disposed on one side of the first layer facing the second layer, wherein the first interconnection layer comprises a plurality of first interconnect structures electrically connected on the first electrode pattern and the second electrode pattern;
   a second interconnection layer, disposed on one side of the second layer facing the first layer, wherein the second interconnection layer comprises a plurality of second interconnect structures electrically connected on the third electrode pattern and the fourth electrode pattern, wherein the first interconnect structures on the first electrode pattern are hybrid bonded with the second interconnect structures on the third electrode pattern, and the first interconnect structures on the second electrode pattern are hybrid bonded with the second interconnect structures on the fourth electrode pattern; and
   a bonding interface between the first interconnection layer and the second interconnection layer, wherein the first interconnection layer further comprises a first dielectric material and the second interconnection layer further comprises a second dielectric material, wherein the first interconnect structures are in contact with the second interconnect structures at the bonding interface, and the first dielectric material is in contact with the second dielectric material at the bonding interface.

2. The semiconductor structure according to claim 1, wherein the number of the first interconnect structures is the same as the number of the second interconnect structures.

3. The semiconductor structure according to claim 1, wherein the first electrode pattern and the third electrode pattern form a hybrid bonding, and the second electrode pattern and the fourth electrode pattern form a hybrid bonding.

4. The semiconductor structure according to claim 1, wherein the first electrode pattern and the second electrode pattern have different electric potentials, or the third electrode pattern and the fourth electrode pattern have different electric potentials, whereby a capacitor element is formed by the first electrode pattern, the second electrode pattern, the third electrode pattern and the fourth electrode pattern.

5. The semiconductor structure according to claim 4, wherein the first electrode pattern comprises a plurality of first teeth arranged at intervals and a first connecting portion connecting the plurality of first teeth, the second electrode pattern comprises a plurality of second teeth arranged at intervals and a second connecting portion connecting the plurality of second teeth, and the plurality of first teeth and the plurality of second teeth are arranged in a mutually staggered fashion from opposite directions.

6. The semiconductor structure according to claim 5, wherein the third electrode pattern comprises a plurality of third teeth arranged at intervals and a third connecting portion connecting the plurality of third teeth, the fourth electrode pattern comprises a plurality of fourth teeth arranged at intervals and a fourth connecting portion connecting the plurality of fourth teeth, and the plurality of third teeth and the plurality of fourth teeth are arranged in a mutually staggered fashion from opposite directions, wherein the third connecting part and the plurality of third teeth correspond to the first connecting part and the plurality of first teeth respectively, and the fourth connecting part and the plurality of fourth teeth correspond to the second connecting part and the plurality of second teeth respectively.

7. The semiconductor structure according to claim 6, wherein the first connecting portion and the third connecting portion are electrically connected to a first voltage, the second connecting portion and the fourth connecting portion are electrically connected to a second voltage, and the first voltage is different from the second voltage.

8. The semiconductor structure according to claim 6, wherein the first interconnect structures are disposed on the first teeth and the second teeth, and the second interconnect structures are disposed on the third teeth and the fourth teeth.

9. The semiconductor structure according to claim 6, wherein the first electrode pattern further comprises a plurality of first protrusions arranged at intervals on a first side surface of each of the first teeth, the second electrode pattern further comprises a plurality of second protrusions arranged at intervals on a second side surface of each of the second teeth, the first side surface and the second side surface are opposite, and the first protrusions and the second protrusions are arranged in a staggered manner.

10. The semiconductor structure according to claim 9, wherein the third electrode pattern further comprises a plurality of third protrusions arranged at intervals on a third side surface of each of the third teeth, the fourth electrode pattern further comprises a plurality of fourth protrusions arranged at intervals on a fourth side surface of each of the fourth teeth, the third side surface and the fourth side surface are opposite, and the third protrusions and the fourth protrusions are arranged in a staggered manner.

11. The semiconductor structure according to claim 10, wherein the first interconnect structures are disposed on the first protrusions and the second protrusions, and the second interconnect structures are disposed on the third protrusions and the fourth protrusions.

12. The semiconductor structure according to claim 1, wherein the first interconnect structures and the second interconnect structures are pads, via contacts, or combinations thereof.

\* \* \* \* \*